(12) United States Patent
Huang et al.

(10) Patent No.: US 7,858,404 B2
(45) Date of Patent: Dec. 28, 2010

(54) MEASUREMENT OF OVERLAY OFFSET IN SEMICONDUCTOR PROCESSING

(75) Inventors: Te-Chih Huang, Chu-Bei (TW); Chih-Ming Ke, Hsin-Chu (TW); Tsai-Sheng Gau, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 235 days.

(21) Appl. No.: 11/686,078

(22) Filed: Mar. 14, 2007

(65) Prior Publication Data

US 2008/0227228 A1    Sep. 18, 2008

(51) Int. Cl.
*H01L 21/66* (2006.01)
*G01R 31/26* (2006.01)
*G01B 11/00* (2006.01)
*G03F 9/00* (2006.01)
*G03C 5/00* (2006.01)

(52) U.S. Cl. .................... 438/16; 356/399; 356/400; 356/401; 430/22; 430/30

(58) Field of Classification Search .............. 438/14
See application file for complete search history.

(56) References Cited

U.S. PATENT DOCUMENTS

| | | | |
|---|---|---|---|
| 6,970,255 B1 * | 11/2005 | Spady et al. ............. | 356/616 |
| 6,982,793 B1 * | 1/2006 | Yang et al. ............... | 356/401 |
| 6,985,229 B2 * | 1/2006 | Lee et al. ................. | 356/401 |
| 7,230,704 B2 * | 6/2007 | Sezginer et al. .......... | 356/401 |
| 2004/0229471 A1 * | 11/2004 | Abdulhalim et al. ..... | 438/736 |
| 2004/0257571 A1 * | 12/2004 | Mieher et al. ............ | 356/401 |
| 2005/0018190 A1 * | 1/2005 | Sezginer et al. .......... | 356/401 |
| 2005/0072945 A1 * | 4/2005 | Fukazawa et al. ...... | 250/559.45 |
| 2005/0105092 A1 * | 5/2005 | Ausschnitt et al. ...... | 356/401 |
| 2006/0117293 A1 * | 6/2006 | Smith et al. .............. | 716/19 |
| 2006/0146347 A1 * | 7/2006 | Smith et al. .............. | 356/625 |
| 2007/0100529 A1 * | 5/2007 | Blythe et al. ............. | 701/51 |

* cited by examiner

*Primary Examiner*—Charles D Garber
*Assistant Examiner*—Pape Sene
(74) *Attorney, Agent, or Firm*—Haynes and Boone, LLP

(57) ABSTRACT

A method of semiconductor manufacturing including forming an overlay offset measurement target including a first feature on a first layer and a second feature on a second layer. The first feature and the second feature have a first predetermined overlay offset. The target is irradiated. The reflectivity of the irradiated target is determined. An overlay offset for the first layer and the second layer is calculated using the determined reflectivity.

9 Claims, 6 Drawing Sheets

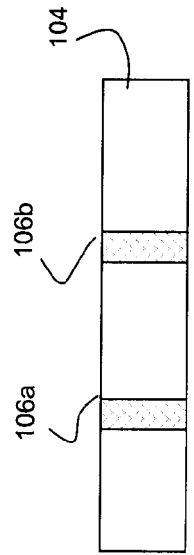
Fig. 1a
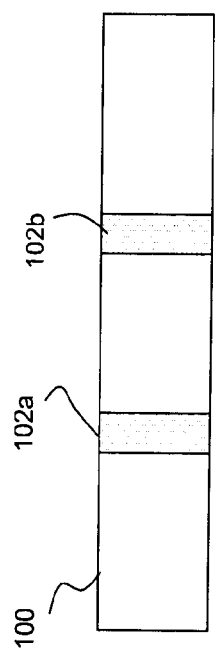
Fig. 1b
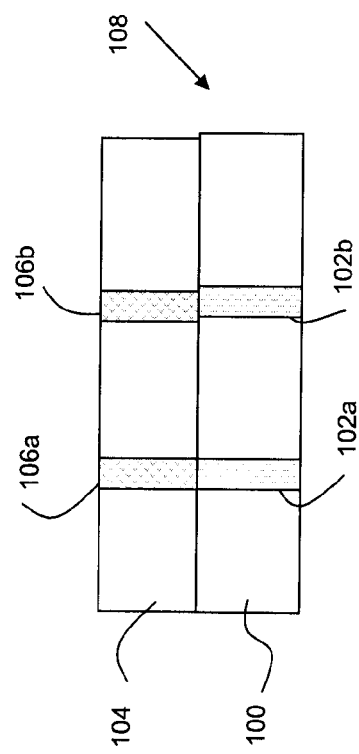
Fig. 1c
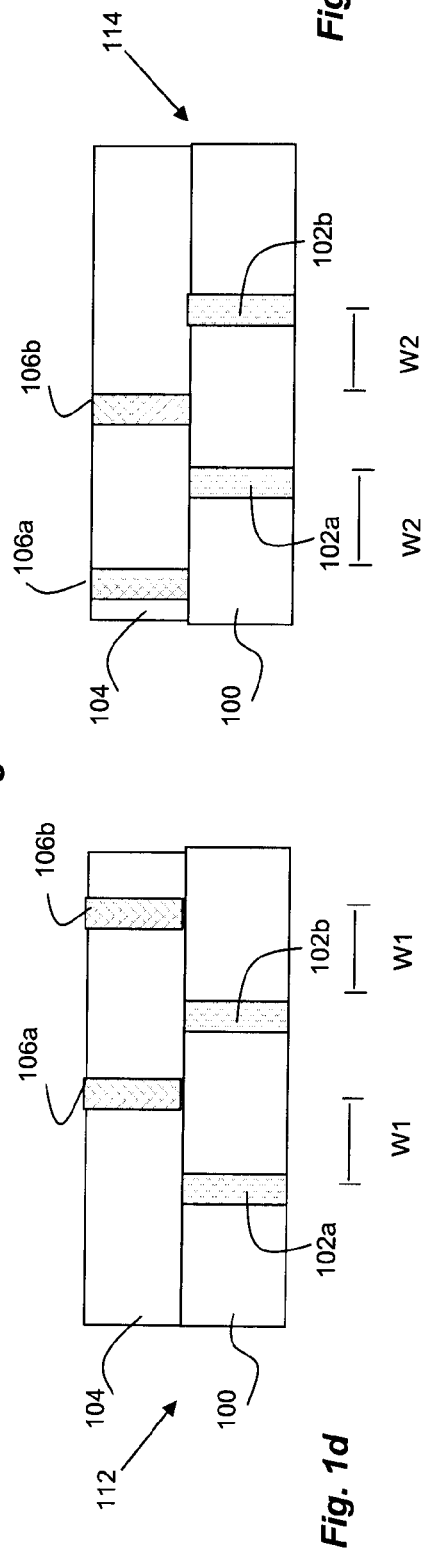
Fig. 1d
Fig. 1e

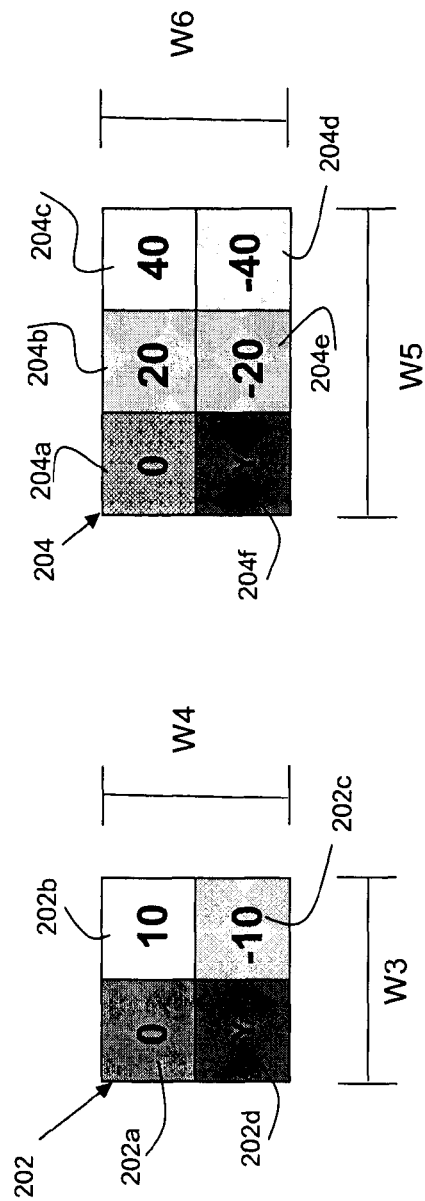
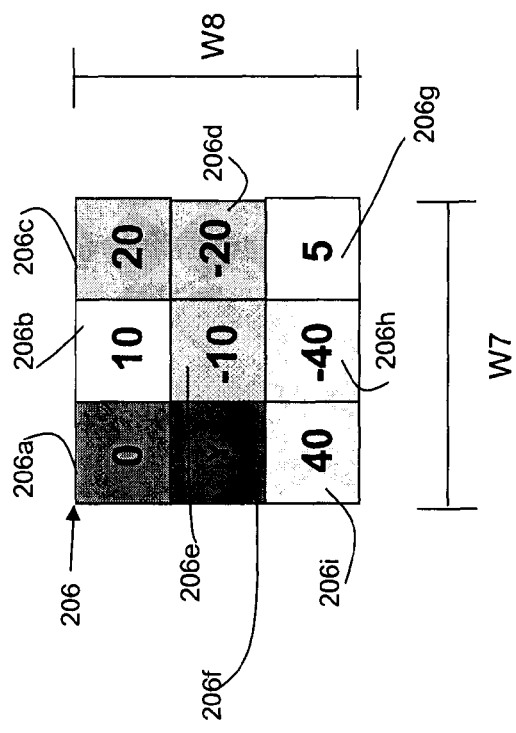
Fig. 2a
Fig. 2b
Fig. 2c

MEASUREMENT OF OVERLAY OFFSET IN SEMICONDUCTOR PROCESSING

BACKGROUND

The present disclosure relates generally to semiconductor fabrication, and more particularly, to the measurement of overlay offset of a plurality of layers of a semiconductor substrate.

Semiconductor devices are fabricated by creating a sequence of patterned and un-patterned layers where the features on patterned layers are spatially related to one another. Thus during fabrication, each patterned layer must be aligned with a previous patterned layer, and as such, the overlay between a first layer and a second layer must be taken into account. The overlay is the relative position between two or more layers of a semiconductor substrate such as, for example, a wafer. As semiconductor processes evolve to provide for smaller critical dimensions, and devices reduce in size and increase in complexity including number of layers, the alignment precision between layers becomes increasingly more important to the quality, reliability, and yield of the devices. The alignment precision is measured as overlay offset, or the distance and direction a layer is offset from precise alignment with a previous layer. Misalignment of layers can cause performance issues and even potentially causing a device to fail due to, for example, a short caused by a misaligned interconnect layer. Therefore, it is necessary to measure the overlay offset between layers during processing to allow for possible correction.

Alignment and alignment measurement techniques are known in the art such as, for example, the use of box-in-box alignment targets. However, many of these techniques are unable to perform to the accuracy which may be required for state-of-the-art processing. Other techniques such as, for example, scatterometry may have increased accuracy, but require substantial, complicated modeling, making the techniques cumbersome and time-consuming. Many techniques also require sizeable targets that occupy substantial space on the wafer and as such may take away potentially valuable wafer space. Overlay measurement techniques known in the art also may be disadvantageous as they may include sensitivity to the uniformity of the layers present on the substrate.

Accordingly, it would be desirable to provide for improved overlay offset measurement.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1a is a cross-sectional perspective view illustrating a plurality of features on a first layer of a wafer.

FIG. 1b is a cross-sectional perspective view illustrating a plurality of features on a second layer of a wafer.

FIG. 1c is a cross-sectional perspective view illustrating an embodiment of the overlay of the layers of FIGS. 1a and 1b.

FIG. 1d is a cross-sectional perspective view illustrating an embodiment of the overlay of the layers of FIGS. 1a and 1b.

FIG. 1e is a cross-sectional perspective view illustrating an embodiment of the overlay of the layers of FIGS. 1a and 1b.

FIG. 2a is a schematic illustrating an embodiment of a design for an overlay offset measurement target.

FIG. 2b is a schematic illustrating an embodiment of a design for an overlay offset measurement target.

FIG. 2c is a schematic illustrating an embodiment of a design for an overlay offset measurement target.

FIG. 4b is a graph illustrating an embodiment of a reflectivity profile determined using the method of FIG. 4a.

FIG. 4c is a graph illustrating an embodiment of a reflectivity profile determined using the method of FIG. 4a.

DETAILED DESCRIPTION

Figure 3:
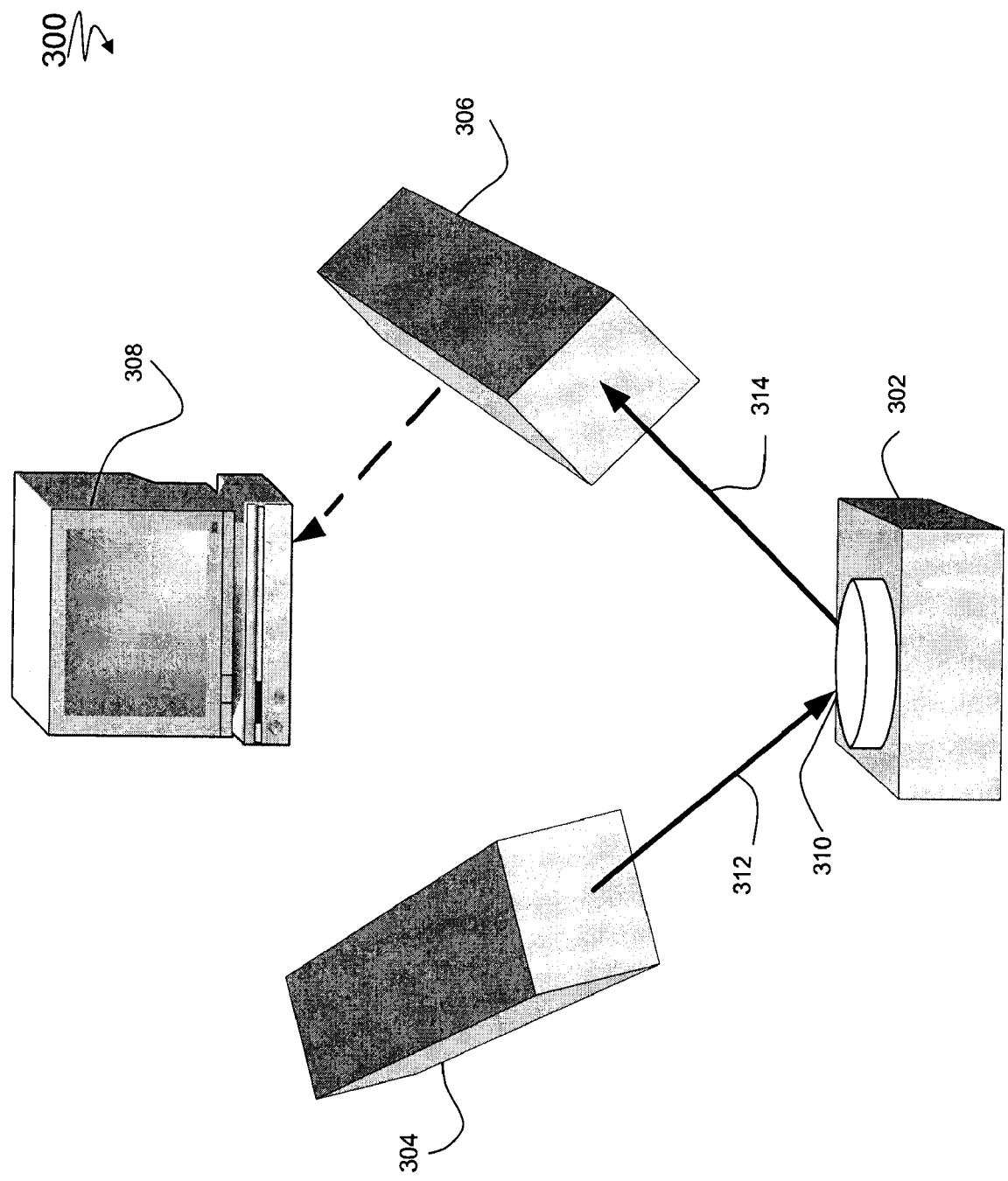
FIG. 3 is a schematic illustrating an embodiment of an overlay offset measurement system.

The present disclosure relates generally to the fabrication of semiconductor devices, and more particularly, to measuring overlay offset of a plurality of layers of a wafer. It is understood, however, that specific embodiments are provided as examples to teach the broader inventive concept, and one of ordinary skill in the art can easily apply the teaching of the present disclosure to other methods or apparatus. Also, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings.

Referring to FIGS. 1a and 1b, a first layer 100 and a second layer 104 of a semiconductor wafer are illustrated respectively. The first layer 100 includes a plurality of features 102a and 102b. The second layer 104 includes a plurality of features 106a and 106b. Additional features may be present and/or the features 102a, 102b, 106a, and/or 106b may have different form factors than illustrated including for example, lines of various dimensions, geometric shapes, and/or trenches. In an embodiment, the features of the first layer 100 and the second layer 104 are substantially the same form factor. The features 102a, 102b, 106a, and 106b are defined by a mask set used in the processing of the wafer and may be fabricated using semiconductor processing methods and materials as known in the art. For example, the features 102a, 102b, 106a, and 106b may be fabricated of photoresist, dielectric, oxide, metal, and/or a variety of other materials as known in the art. The features 102a, 102b, 106a, and 106b may be fabricated by processes including electroplating, ion implantation, deposition including chemical vapor deposition, spin coating to deposit material, etch processing, chemical mechanical polishing, and/or a variety of other processes as known in the art. The first layer 100 may be fabricated prior to the second layer 104 and as such the second layer 104 positioned above of the first layer 100 on the wafer. In an embodiment, the first layer 100 and the second layer 104 may be adjacent one another. In an embodiment, one or more additional patterned or un-patterned layers may be located between the first layer 100 and the second layer 104. In an embodiment, the wafer including the first layer 100 and the second layer 104 may include additional layers fabricated prior to the first layer 100. In an embodiment, the wafer including the first layer 100 and the second layer 104 may include a plurality of layers fabricated after the second layer 104. In an embodiment, the features 102a, 102b, 106a, and 106b may extend between and among various layers.

Referring now to FIG. 1c, an embodiment of the overlay of the first layer 100, described above with reference to FIG. 1a, and the second layer 104, described above with reference to FIG. 1b, is illustrated. A wafer segment 108 has the second layer 104 overlaying the first layer 100. The wafer segment 108 has approximately no overlay offset of the first layer 100 and the second layer 104 as the features 102a and 102b of the first layer 100 and the features 106a and 106b of the second layer 104, respectively, are substantially aligned with one another. In an embodiment, an overlay offset measurement target may include the wafer segment 108.

Referring now to FIGS. 1d and 1e, embodiments of the overlay of the first layer 100, described above with reference to FIG. 1a, and the second layer 104, described above with reference to FIG. 1b, are illustrated. Specifically, a wafer segment 112 and a wafer segment 114, both having the second layer 104 overlay the first layer 100, are illustrated. The wafer segment 112 has an overlay offset of the first layer 100 and the second layer 104 of W1. The wafer segment 114 has an overlay offset of the first layer 100 and the second layer 104 of W2. The overlay offsets W1 and W2 include the distance the second layer 104 is from being directly aligned with the first layer 100. In the illustrated embodiment of the wafer segment 112, the second layer 104 is offset to the right of the first layer 104, hereinafter arbitrarily considered a positive value overlay offset for the purpose of this disclosure. In the illustrated embodiment of the wafer segment 114, the second layer 104 is offset to the left of the first layer 104, hereinafter arbitrarily considered a negative value overlay offset for purposes of this disclosure. In an embodiment, the overlay offsets W1 and W2 are process-induced overlay offsets. Process-induced overlay offset includes offsets arising from the misalignment of a mask, for example, the misalignment of the mask for the second layer 104 and the wafer including the first layer 100 during a photolithography process. The misalignment of the mask may occur because of, for example, operator error, machine malfunction, limited machine capability, and/or process variation. In an embodiment, the overlay offsets W1 and W2 arise because they were predetermined overlay offsets. Predetermined overlay offset includes offsets that were intentionally designed for and included in the mask set for the wafer by, for example, shifting a feature of a second layer from alignment with a feature of a first layer. In an embodiment, the overlay offsets W1 and W2 occur both because of predetermined overlay offset and process-induced overlay offset. In an embodiment, an overlay offset measurement target includes the wafer segment 112. In an embodiment, an overlay offset measurement target includes the wafer segment 114.

Referring now to FIGS. 2a, 2b, and 2c, a plurality of overlay offset measurement target designs 202, 204, and 206 are illustrated. The target designs 202, 204, and 206 may be included in a mask set and may be fabricated on a wafer concurrently with the semiconductor device. The target designs 202, 204, and 206 when fabricated may be used as overlay offset measurement targets. An overlay offset measurement target may be used to measure the overlay offset, which includes the approximate distance from precise alignment, of a plurality of layers on a wafer that includes the overlay offset measurement target. Each target design includes numerous cells; the target design 202 includes cells 202a, 202b, 202c, and 202d, the target design 204 includes cells 204a, 204b, 204c, 204d, 204e, and 204f, and the target design 206 includes cells 206a, 206b, 206c, 206d, 206e, 206f, 206g, 206h, and 206i. Each cell includes a plurality of features, including at least one feature fabricated on a first layer and one feature fabricated on a second layer. The cells may include the features and layers described above with reference to FIGS. 1a, 1b, 1c, 1d, and/or 1e. The target designs 202, 204, and 206 may be fabricated on the wafer in the scribe lines between active devices, within the circuitry of the active devices, and/or elsewhere on the wafer. In an embodiment, each cell of the target design, when fabricated on the wafer, is of a size operable to allow the reflectivity of the cell when irradiated to be detected. In an embodiment, the spot size of a radiation source is 1 µm and each fabricated cell size is greater than 1 µm.

Although three embodiments of overlay offset measurement target designs are illustrated, numerous other embodiments are possible including variations in target size, cell size, predetermined overlay offsets, and/or cell configuration. In an embodiment, illustrated in FIG. 2a, the target design 202 includes the cell 202a having a first feature and a second feature with no predetermined overlay offset (designated as "0"), the cell 202b located adjacent to the cell 202a and having a first feature and a second feature with a predetermined overlay of 10 nanometers (designated as "10"), the cell 202c located adjacent to the cell 202b and having a first feature and a second feature with a predetermined overlay offset of 10 nanometers offset in the direction opposite the offset of cell 202c (designated as "−10"), and the cell 202d located adjacent to the cells 202a and 202c and having a grating (designated as "Y"). The grating may be a grating in a direction perpendicular to the predetermined overlay offsets (e.g. in the vertical direction) and used determine the overlay offset in that direction (e.g. the offset in the vertical direction). In an embodiment, the cells 202a, 202b, 202c, and 202d include additional features. In an embodiment, the features included in the cells 202a, 202b, 202c, and 202d of the target design 202 include the features 102a, 102b, 106a, and/or 106b, described above with reference to FIGS. 1a, 1b, 1c, 1d, and 1e. In an embodiment, the cell 202c design when fabricated includes the wafer segment 112, described above in reference to FIG. 1d, and W1, also described above in reference to FIG. 1d, is approximately 10 nanometers. In an embodiment, the cell 202c design when fabricated includes the wafer segment 114, described above in reference to FIG. 1e, and W2, also described above in reference to FIG. 1e, is approximately 10 nanometers. In an embodiment, the cell 202a design when fabricated includes the wafer segment 108, described above in reference to FIG. 1c. In an embodiment, W3 is approximately 4 µm and W4 is approximately 4 µm.

In an embodiment, illustrated in FIG. 2b, the target design 204 includes the cell 204a having a first feature and a second feature with no predetermined overlay offset (designated as "0"), the cell 204b located adjacent to the cell 204a and having a first feature and a second feature with a predetermined overlay offset of 20 nanometers (designated as "20"), the cell 204c located adjacent to the cell 204b and having a first feature and a second feature with a predetermined overlay offset of 40 nanometers (designated as "40"), the cell 204d located adjacent to the cell 204c and having a first feature and a second feature with a predetermined overlay offset of 40 nanometers in a direction opposite the offset of the cell 204c (designated as "−40"), the cell 204e located adjacent to the cells 204b and 204d and having a first feature and a second feature with a predetermined overlay offset of 20 nanometers in a direction opposite the offset of the cell 204b (designated as "−20"), and the cell 204f located adjacent to the cells 204a and 204e and having a grating (designated as "Y"). The grating may be a grating oriented in a direction perpendicular to the predetermined overlay offsets (e.g. in the vertical direction) and used to determine the overlay offset in that direction (e.g. in the vertical direction). In an embodiment, the features included in the cells 204*a*, 204*b*, 204*c*, 204*d*, 204*e*, and 204*f* of the target design 204 include the features 102*a*, 102*b*, 106*a*, and/or 106*b* as described above with reference to FIGS. 1*a*, 1*b*, 1*c*, 1*d*, and 1*e*. In an embodiment, the cell 204*b* design when fabricated includes the wafer segment 112, described above in reference to FIG. 1*d*, and W1, also described above in reference to FIG. 1*d*, is approximately 20 nanometers. In an embodiment, the cell 204*c* design when fabricated includes the wafer segment 112, described above in reference to FIG. 1*d*, and W1, also described above in reference to FIG. 1*d*, is approximately 40 nanometers. In an embodiment, the cell 204*d* design when fabricated includes the wafer segment 114, described above in reference to FIG. 1*e*, and W2, also described above in reference to FIG. 1*e*, is approximately 40 nanometers. In an embodiment, the cell 204*e* design when fabricated includes the wafer segment 114, described above in reference to FIG. 1*e*, and W2, also described above in reference to FIG. 1*e*, is approximately 20 nanometers. In an embodiment, the cell 204*a* design when fabricated includes the wafer segment 108, described above in reference to FIG. 1*c*. In an embodiment, W5 is approximately 12 μm and W6 is approximately 8 μm.

In an embodiment, illustrated in FIG. 2*c*, the target design 206 includes the cell 206*a* having a first feature and a second feature with no predetermined overlay offset (designated as "0"), the cell 206*b* located adjacent to the cell 206*a* and having a first feature and a second feature with a predetermined overlay offset of 10 nanometers (designated as "10"), the cell 206*c* located adjacent to the cell 206*b* and having a first feature and a second feature with a predetermined overlay offset of 20 nanometers (designated as "20"), the cell 206*d* located adjacent to the cell 206*c* and having a first feature and a second feature with a predetermined overlay offset of 20 nanometers in a direction opposite the offset of cell 206*c* (designated as "−20"), the cell 206*e* located adjacent the cells 206*b* and 206*d* and having a first feature and a second feature with a predetermined overlay offset of 10 nanometers in a direction opposite the offset of the cell 206*b* (designated as "−10"), the cell 204*f* located adjacent the cells 206*a* and 206*e* and having a grating (designated as "Y"), the cell 206*g* located adjacent to the cell 206*d* and having a first feature and a second feature with a predetermined offset of 40 nanometers (designated as "40"), the cell 206*h* located adjacent to the cells 206*g* and 206*e* and having a first feature and a second feature with a predetermined offset of 40 nanometers in a direction opposite the offset of the cell 206*g*, and the cell 206*i* located adjacent to the cells 206*f* and 206*h* and having a first feature and a second feature with a predetermined offset of 5 nanometers (designated as "5"). The grating of the cell 204*f* may be a grating oriented in the direction perpendicular to the predetermined overlay offsets (e.g. in the vertical direction) and used to determine the overlay offset in that direction (e.g. in the vertical direction). In an embodiment, the features included in the cells 206*a*, 206*b*, 206*c*, 206*d*, 206*e*, 206*f*, 206*g*, 206*h*, and 206*i* of the target design 206 include the features 102*a*, 102*b*, 106*a*, and/or 106*b*, described above with reference to FIGS. 1*a*, 1*b*, 1*c*, 1*d*, and 1*e*. In an embodiment, the cell 206*b* design when fabricated includes the wafer segment 112, described above in reference to FIG. 1*d*, and W1, also described above in reference to FIG. 1*d*, is approximately 10 nanometers. In an embodiment, the cell 206*c* design when fabricated includes the wafer segment 112, described above in reference to FIG. 1*d*, and W1, also described above in reference to FIG. 1*d*, is approximately 20 nanometers. In an embodiment, the cell 206*g* design when fabricated includes the wafer segment 112, described above in reference to FIG. 1*d*, and W1, also described above in reference to FIG. 1*d*, is approximately 5 nanometers. In an embodiment, the cell 206*i* design when fabricated includes the wafer segment 112, described above in reference to FIG. 1*d*, and W1, also described above in reference to FIG. 1*d*, is approximately 40 nanometers. In an embodiment, the cell 206*d* design when fabricated includes the wafer segment 114, described above in reference to FIG. 1*e*, and W2, also described above in reference to FIG. 1*e*, is approximately 20 nanometers. In an embodiment, the cell 206*e* design when fabricated includes the wafer segment 114, described above in reference to FIG. 1*e*, and W2, also described above in reference to FIG. 1*e*, is approximately 10 nanometers. In an embodiment, the cell 206*h* design when fabricated includes the wafer segment 114, described above in reference to FIG. 1*e*, and W2, also described above in reference to FIG. 1*e*, is approximately 40 nanometers. In an embodiment, the cell 206*a* design when fabricated includes the wafer segment 108, described above in reference to FIG. 1*c*. In an embodiment, W7 is approximately 12 μm and W8 is approximately 12 μm.

Referring now to FIG. 3, a measurement system 300 for measuring the overlay offset of a plurality of layers on a wafer is illustrated. The measurement system 300 includes a radiation source 304, a detector 306, a stage 302, and a calculation unit 308. A wafer 310 is located on the stage 302. The wafer 310 may include at least one overlay offset measurement target, which may be fabricated from a target design such as those described above in reference to FIGS. 2*a*, 2*b*, and 2*c*. In an embodiment, the radiation source 304 is a laser. The radiation source 304 generates radiation 312 which irradiates the wafer 310. In an embodiment, the wafer 310 is irradiated specifically at each cell of an overlay offset measurement target located on the wafer 310. In an embodiment, the radiation 312 may be p-polarized. In another embodiment, the radiation 312 may be s-polarized. In an embodiment, the spot size of the radiation is approximately 1 μm. The detector 306 is operable to measure the reflectivity of the radiation 314 from the wafer 310. In an embodiment, the radiation source 304 and the detector 306 may be included in equipment used for semiconductor fabrication such as, for example, photolithography tools. The calculating unit 308 receives information, illustrated by the dashed line in FIG. 2, including detected reflectivity, from the detector 306. The calculating unit 308 is operable to receive, send, manipulate, and/or store data. The calculating unit 308 may send information to and/or receive information from other semiconductor fabrication equipment, including the radiation source 304. The calculating unit 308 may be, for example, a computer, software imbedded in semiconductor manufacturing equipment including the detector 306, and/or imbedded in process control tools and/or software.

Figure 4A:
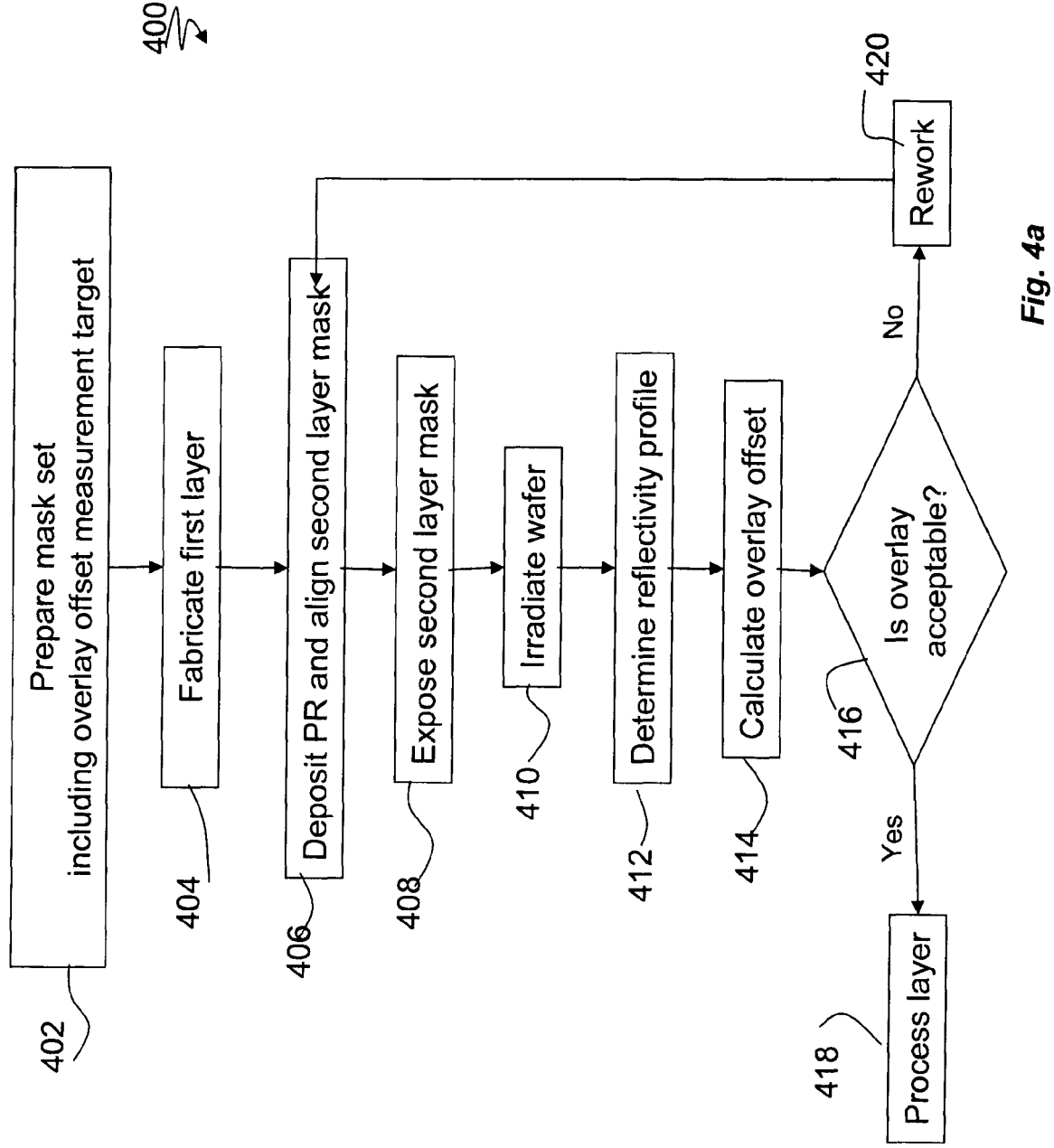
FIG. 4a is a flow chart illustrating an embodiment of a method for processing semiconductor wafers including measurement of the overlay offset of two layers of a wafer.
Figure 4B:
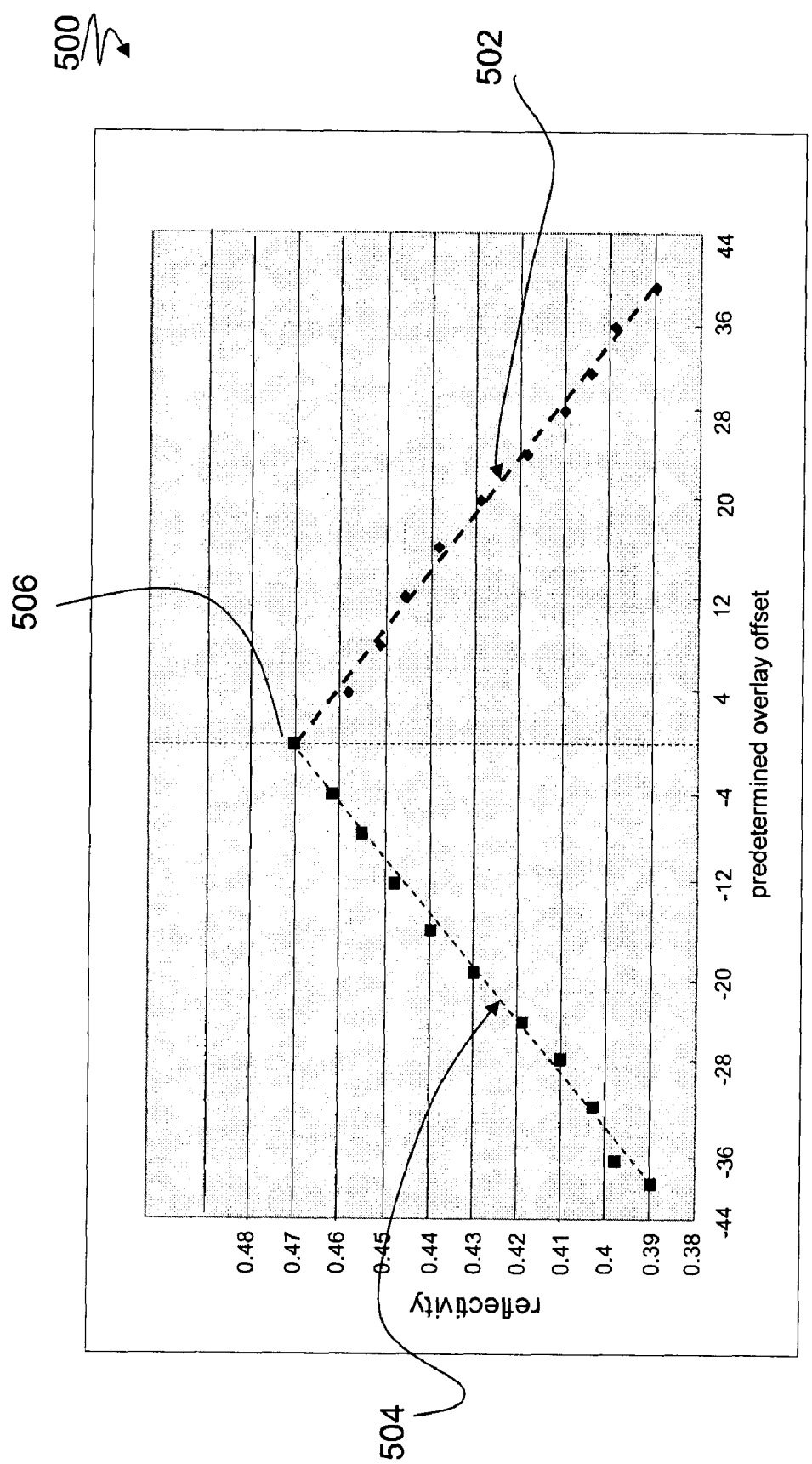
Figure 4C:
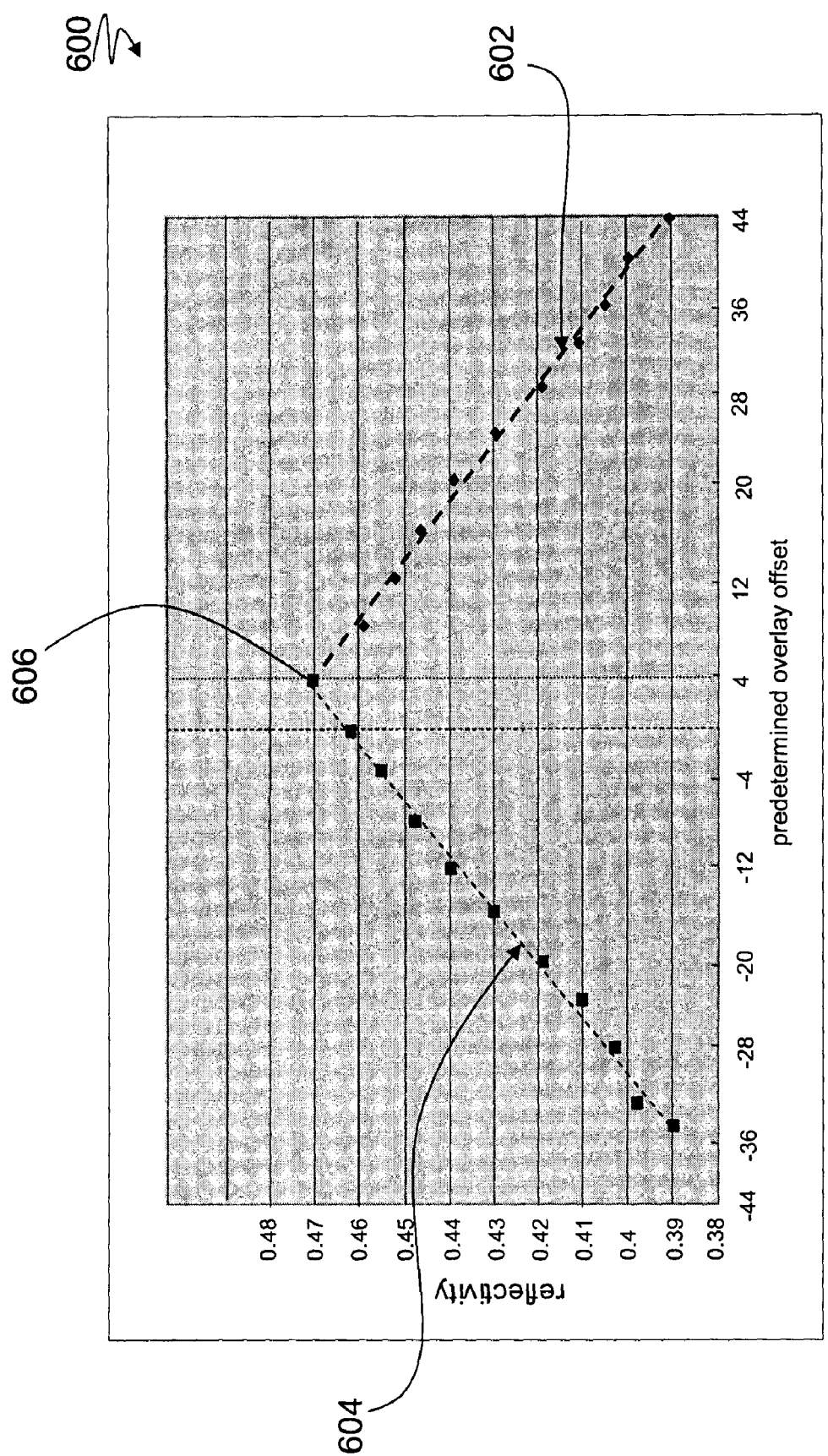

Referring now to FIGS. 4*a*, 4*b*, and 4*c*, a method 400 for determining the process-induced overlay offset of a plurality of layers of a wafer illustrated. In the illustrated embodiment, the process-induced overlay offset of a first layer and a second layer on a wafer is illustrated, though the method may be used for any plurality of layers on a wafer, adjacent or non-adjacent. The method 400 begins at step 402 where a mask set is prepared that includes an overlay offset measurement target which provides a plurality of features with a plurality of predetermined overlay offsets. The overlay offset measurement target may be fabricated using a target design such as, for example, the target designs 202, 204, and/or 206, as described above in reference to FIGS. 2*a*, 2*b*, and 2*c*. In an embodiment of the method 400, the overlay offset measurement target includes at least one feature on the first layer and at least one feature on the second layer such as, for example, the features 102*a*, 102*b*, 106*a*, and/or 106*b*, described above in reference to FIGS. 1a and 1b, and is used to determine the process-induced overlay offset of the first and second layers.

The method 400 proceeds with the semiconductor fabrication process including step 404 where the first layer, including the overlay offset measurement target features located on the first layer, is fabricated.

The method 400 then proceeds to the processing of the second layer including step 406 where photoresist is deposited and a mask for the second layer is exposed. In an embodiment, this allows the fabrication of a feature formed of photoresist (PR) on the second layer of the wafer such as, for example, the feature 106a and/or 106b, described above with reference to FIGS. 1b, 1c, 1d, and 1e. In alternative embodiments, the method 400 includes other processing steps of the second layer and includes a feature on the second layer fabricated of substantially non-PR material. The method 400 then continues to step 408 where the photoresist is patterned.

The method 400 then continues to step 410, where the wafer is irradiated by a radiation source. The wafer may be irradiated at the location of the overlay offset measurement target.

The reflectivity from the irradiated wafer is detected and measured in step 412. This process of irradiation and detection of reflectivity may be repeated for each cell of a multiple cell overlay offset measurement target such as, for example, an overlay offset measurement target provided using the target designs 202, 204, and/or 206, described above in reference to FIGS. 2a, 2b, and 2c. The irradiation and detection of reflectivity may be performed by a measurement system such as, for example, the measurement system 300, described above in reference to FIG. 3. Thereafter, a reflectivity profile is determined. In an embodiment, the reflectivity also may be used to determine the thickness of a layer on the wafer. The reflectivity profile may be determined by a calculation unit of a measurement system such as, for example, the calculation unit 308 of the measurement system 300, described above with reference to FIG. 3.

To determine the reflectivity profile, a plot is made of the predetermined overlay offset of a cell and the reflectivity detected from that cell. This is done for the predetermined overlay offsets in both directions (e.g. positive value overlay offsets and negative value overlay offsets as designated above). A pair of lines are fit to the plotted points. The reflectivity may decrease with an increased actual overlay offset. The actual overlay offset includes the sum of the process-induced overlay offset and the predetermined overlay offset. The reflectivity may also decrease approximately equivalently for the increase of actual overlay offset in either offset direction (e.g. positive value overlay offsets and negative value overlay offsets). As such, symmetrical lines may be fit to the plotted points.

The method 400 then proceeds to step 414 where the process-induced overlay offset is determined. The intersection of the lines comprising the reflectivity profile produced in step 412 is determined. The intersection may designate the predetermined overlay offset that yields an actual overlay offset of approximately zero. The intersection may be at the point of highest reflectivity on the reflectivity profile. By subtracting the predetermined overlay offset from the actual overlay offset, the process-induced overlay offset can be determined.

In an embodiment of the method 400, a reflectivity profile 500 (FIG. 4b) is generated in step 412. Lines 502 and 504 are fit to the plotted points of the predetermined overlay offset and the reflectivity for each cell of the overlay offset measurement target. In an experimental embodiment, such as the reflectivity profile 500, the $R^2$ (the correlation coefficient) of the fitted lines 502 and 504 may be approximately 0.99. The method 400 then continues to step 414, where the intersection of the lines 502 and 504 is determined. For the reflectivity profile 500, the intersection occurs at a point referenced as 506, which is at a reflectivity of approximately 0.46 and a predetermined overlay offset of approximately zero. The intersection point 506 is at the predetermined overlay offset which yields an actual overlay offset of approximately zero. In the embodiment, there is approximately zero process-induced offset for the wafer.

During production-level semiconductor processing, typically the process-induced overlay offset may not be zero thus, and the point of highest reflectivity on the reflectivity profile may occur at a predetermined overlay offset other than zero.

In another embodiment, the reflectivity profile 600 (FIG. 4c) is generated in step 412 as lines 602 and 604 are fit to the plotted points of reflectivity versus predetermined overlay offset of the overlay offset measurement target provided. In the embodiment, in step 416 of the method 400 the intersection of the lines 602 and 604 is determined to be at a predetermined overlay offset of +4 nanometers, as illustrated by point 606. The point 606 illustrates the predetermined overlay offset, +4 nanometers, where the actual overlay offset is approximately zero. Thus, for the illustrate embodiment, the process-induced overlay offset for the wafer is approximately 4 nanometers in the direction opposite the predetermined overlay offset of point 606, arbitrarily designated the negative direction (e.g. the second layer shifted to the left of the first layer).

The embodiments illustrated in FIGS. 4b and 4c include numerous points plotted to generate the reflectivity profile. A greater number of predetermined overlay offsets and their corresponding reflectivity may allow for a more accurate estimate of the overlay offset. However, overlay offset measurement targets with fewer predetermined overlay offsets are possible and may be preferable in order to reduce the size of the overlay offset measurement target. The method 400 may determine the process-induced overlay offset without sensitivity to variations in thickness or density of layers present on the wafer or the wafer itself. In an embodiment, the overlay offset measurement target provided in step 402 includes a grating in a direction perpendicular to the predetermined overlay offsets included in the other cells of the overlay offset measurement target, such as, for example, the cells 202d, 204f, 206f, described above in reference to FIGS. 2a, 2b, and 2c respectively. In the embodiment, the grating is also irradiated and the reflectivity determined. The reflectivity of the grating may be compared to the reflectivity curve, and the offset of the first layer and the second layer in the direction perpendicular (e.g. vertical offset) to the predetermined overlay offsets may be determined.

The method 400 then continues to 416 where the process-induced overlay offset is evaluated to determine if it is acceptable to continue to process the wafer. If the process-induced overlay offset is acceptable, the wafer continues to step 418 where the processing of the wafer continues, as known in the art. If the process-induced overlay offset is unacceptable, the method 400 continues to step 420 where the wafer is reworked, for example, the photoresist of layer two removed and the second layer mask realigned. The method 400 the proceeds to step 406 as described above.

It should be noted that the method 400 may includes steps required or desired in semiconductor processing that are not illustrated but known to one in the art. Additionally, the method 400 is but one embodiment of the use of radiation in determining the process-induced overlay offset of a wafer. The method 400 may be adapted to provide measurement of overlay offset elsewhere in the lithography process, and/or elsewhere in the semiconductor fabrication process, including, for example, in aligning a layer prior to exposing a mask for the layer, and/or measuring the overlay offset of a layer after completing the fabrication of the layer.

Although only a few exemplary embodiments of this invention have been described in detail above, those skilled in the art will readily appreciate that many modifications are possible in the exemplary embodiments without materially departing from the novel teachings and advantages of this disclosure.

In one embodiment, a method of semiconductor manufacturing is provided. An overlay offset measurement target including a first feature on a first layer and a second feature on a second layer is formed. The first feature and the second feature have a predetermined overlay offset. The overlay target is irradiated. The reflectivity from the irradiated target is determined. An overlay offset for the first layer and the second layer is calculated using the determined reflectivity.

In another embodiment, a system for overlay offset measurement in semiconductor manufacturing is provided. A radiation source is provided. The radiation source is operable to irradiate an overlay offset measurement target. A detector is provided. The detector is operable to detect reflectivity of the irradiated overlay offset measurement target. A calculation unit is provided. The calculation unit is operable to determine an overlay offset using the detected reflectivity.

In another embodiment, a system for overlay offset measurement in semiconductor manufacturing is provided. A radiation source for irradiating an overlay offset measurement target is provided. A detector for detecting reflectivity of the irradiated overlay offset measurement target is provided. A calculation unit for determining an overlay offset using the detected reflectivity is provided.

In another embodiment, an overlay offset measurement target is provided. The target includes a first feature and a second feature. The first feature and the second feature have a first predetermined overlay offset. The target includes a third feature and a fourth feature. The third feature and the fourth feature have a second predetermined overlay offset. The first predetermined overlay offset is different than the second predetermined overlay offset.

What is claimed is:

1. A method of semiconductor manufacturing, comprising:
   forming an overlay offset measurement target including a first feature and a third feature located on a first layer and a second feature and a fourth feature located on a second layer, wherein the first feature and the second feature have a first predetermined overlay offset and the third feature and the fourth feature have a second predetermined overlay offset, different than the first predetermined overlay offset;
   irradiating the target with a radiation beam having a single wavelength;
   determining a first reflectivity measurement associated with the first and second feature at the single wavelength;
   determining a second reflectivity measurement associated with the third and fourth feature at the single wavelength;
   generating a reflectivity profile which has a first axis including reflectivity at the single wavelength and a second axis including predetermined overlay offset, wherein the generating the reflectivity profile includes:
   plotting the first reflectivity measurement;
   generating a first line fitted to the plotted first reflectivity measurement;
   plotting the second reflectivity measurement; and
   generating a second line fitted to the plotted second reflectivity measurement; and
   calculating an overlay offset for the first layer and the second layer by determining a value on the second axis where the first line and the second line intersect, wherein the value provides a predetermined overlay offset that corresponds to an actual overlay offset of zero.

2. The method of claim 1, further comprising:
   using the calculated overlay offset in determining whether to rework a wafer.

3. The method of claim 1, wherein the first predetermined overlay offset is between approximately 4 nanometers and 40 nanometers.

4. The method of claim 1, wherein the target further includes a fifth feature located on the first layer and a sixth feature located on the second layer, wherein the fifth feature and the sixth feature have a third predetermined overlay offset and wherein the generating a reflectivity profile further includes plotting a third reflectivity measurement associated with the fifth and sixth feature and the generating the first line includes fitting the first line to the plotted third reflectivity measurement.

5. The method of claim 1, wherein the second predetermined overlay offset is different in value and in direction than the first predetermined overlay offset.

6. The method of claim 1, wherein calculating an overlay offset includes determining a predetermined overlay offset that provides an actual overlay offset of approximately zero.

7. The method of claim 6, wherein the determining a predetermined overlay offset that provides an actual overlay offset of approximately zero includes determining a predetermined overlay offset that provides for greatest reflectivity.

8. The method of claim 1, wherein the forming the overlay offset measurement target includes forming the first feature, second feature, third feature, and fourth feature of photoresist.

9. The method of claim 1, further comprising:
   determining a process overlay offset using the determined intersection between the first line and the second line.

* * * * *